US006058070A

United States Patent [19]

La Rosa

[11] Patent Number: 6,058,070

[45] Date of Patent: May 2, 2000

[54] GLITCH IMMUNE ATD CIRCUITRY

[75] Inventor: Francesco La Rosa, Catania, Italy

[73] Assignee: STMicroelectronics S.r.l., Agrate Brianza, Italy

[21] Appl. No.: 09/140,951

[22] Filed: Aug. 27, 1998

[30] Foreign Application Priority Data

Aug. 29, 1997 [IT] Italy .................................. MI97A1986

[51] Int. Cl.[7] ........................................ G11C 8/00

[52] U.S. Cl. ........................................ 365/233.5; 365/194

[58] Field of Search ................................ 365/233.5, 233, 365/194, 189.08; 327/202, 203, 212

[56] References Cited

U.S. PATENT DOCUMENTS

| | | | |
|---|---|---|---|
| 4,893,282 | 1/1990 | Wada et al. | 365/233.5 |
| 5,357,480 | 10/1994 | Vinal | 365/233.5 |
| 5,374,894 | 12/1994 | Fong | 365/233.5 |
| 5,414,659 | 5/1995 | Ito | 365/233.5 |
| 5,883,847 | 3/1999 | Takahashi | 365/233.5 |
| 5,894,449 | 4/1999 | Jung | 365/233.5 |

*Primary Examiner*—Tan T. Nguyen

*Attorney, Agent, or Firm*—Theodore E. Galanthay; Allen, Dyer, Doppelt, Milbrath & Gilchrist, P.A.

[57] ABSTRACT

A glitch immune ATD circuit for electronic memory devices includes a plurality of input pads (A<0>, . . . , A<N>) of the memory device each one connected to a corresponding address input buffer (I0, . . . , IN), with each input buffer comprising an output terminal connected to a corresponding input of a local ATD generator circuit (ATD_GEN_LOC). The circuit also has an output for each local generator (ATD_GEN_LOC) connected to a corresponding input of a logic gate having a plurality (N) of inputs and an output (Y). A global ATD generator circuit has one input connected to the output (Y) of the logic gate and producing a final ATD pulse. The global ATD generator circuit includes a master slave device which is controlled by an input signal (NOTCLK) received from the output (Y) of the logic gate; a central and final ATD generator (ATD_GEN_END) which is connected downstream to the master-slave device; a further logic gate connected to the output of the final ATD generator and producing the final ATD pulse. The ATD circuit according to the invention is able to guarantee the minimum length Tpmin of the ATD pulse under every operating condition.

31 Claims, 18 Drawing Sheets

GLITCH IMMUNE ATD CIRCUITRY

FIELD OF THE INVENTION

The present invention relates to electronic circuits, and, more particularly, to a glitch immune Address Transition Detection (ATD) circuit for a memory device.

BACKGROUND OF THE INVENTION

An ATD circuit for electronic memory devices typically includes a plurality of input pads of the memory device each one connected to a corresponding address input buffer, with each input buffer comprising an output terminal connected to a corresponding input of a local Address Transition Detection (ATD) generator circuit. An output for each local generator is connected to a corresponding input of a logic gate having a plurality of inputs and an output.

As is well known, an electronic memory device may be provided with an ATD circuit which is used to detect any address transition on the address inputs of the memory device and to output a pulse output signal which activates a read operation of the memory device. More specifically, the output signal of the ATD circuit is used to generate a sequence of signals which take care of and control the read operation.

In many applications a known ATD circuit provides a negative pulse which is generated every time an address transition is detected and is interrupted after a predetermined time delay Tatd from the last detected address transition. If we assume that a time delay Td is present between the first detected address transition and the falling edge of the ATD pulse, the ATD circuit should guarantee a minimum width Tpmin of the ATD pulse. This is given by the following relationship:

$$Tpmin=Tatd-Td$$

with $Tp \geqq Tpmin$

The enclosed FIG. 1 shows a graphic representation of these time delays. The enclosed FIG. 2 shows a simplified schematic diagram of a known ATD circuit.

As may be appreciated from FIG. 2, a plurality of input pads A<0>, . . . , A<N> of the memory device represent an array of address inputs each of which is connected to a corresponding address input buffer I0, . . . , IN. Each input buffer comprises an output terminal connected to a corresponding input of an ATD generator circuit ATD_GEN_LOC.

The single output of each ATD generator is connected to an input of a NOR logic gate having N inputs and an output Y. An optional STRETCH circuit may be connected to this output Y. In response to an address transition on one pad A<i>, the corresponding ATD generator produces a positive pulse ATD_LOC_X which generates a negative pulse ATDBUS on the output of the NOR gate. The STRETCH circuit is used to increase the length of the ATDBUS pulse producing the ATD signal.

As a matter of fact, other input signals (i.e. the signal CE) of the memory device can contribute to the ATD generation. However, their contribution will not be considered in the following description since it is not relevant for the comprehension of the inventive principle.

The enclosed FIG. 3 shows a simplified internal structure of an ATD generator circuit ATD_GEN_LOC of a known type. FIG. 4 shows a typical STRETCH circuit used to delay the rising edge of the signal ATDBUS. The STRETCH circuit is substantially formed by a delay chain of logic gates.

It may happen that the above indicated ATD circuit is not able to respond in a proper way when it is stimulated by a glitch. Glitches may be observed on the address inputs due to the noise on the internal power supply and because of the noise on the input level. A set of FIGS. 5*a*, 5*b*, 5*c*, 5*d*, 5*e* show how the above indicated known ATD circuitry responds to an address input transition, and to a glitch, respectively. The response depends on the extent of the glitch.

It may be observed in FIGS. 5*c* and 5*d* respectively that, under some critical conditions, the known ATD circuitry might provide an ATD pulse whose duration is shorter than a conventional one. More specifically, FIG. 5*c* shows a situation in which the ATDBUS pulse is shorter than a conventional pulse of that kind, but the STRETCH circuit is still able to increase the duration of its input signal.

On the contrary, FIG. 5*d* shows a worst case in which the ATDBUS pulse is so short that the STRETCH circuit is not able to respond in a proper way and a final very short ATD pulse is produced. In many applications it is mandatory to guarantee an ATD pulse having a minimum width Tpmin under every operating condition.

FIG. 6 shows a simplified block diagram of the read path of a non-volatile memory circuit using dynamic sense amplifiers. In this figure the signal ATD is presented to the input of a SENSING_CONTROL circuit which provides the sequence of signals to control the sensing operation. In response to the falling edge of the ATD pulse, the SENSING_CONTROL circuit generates a Y_GATE_EN signal which enables the bitline selection of the memory device. In response to the rising edge of the ATD pulse the SENSING_CONTROL circuit provides a sequence of signals to time the sensing operation. As can be easily understood, if the duration of the ATD pulse is shorter than expected, the result of the sensing operation may be wrong since the right timing between the bit line selection and the sensing phase is missing.

For example, after a normal read cycle the noise produced by the internal power supplies due to the output transitioning can trigger a glitch on the input to the ATD circuit. This can generate a spurious ATD pulse thereby starting a new read cycle. In such a case, the memory location of the previous read operation is read again, but the data output remains stable so that the user would not realize the double read operation.

However, if the glitch produces an ATD pulse of very short duration, the corresponding read operation might fail giving a wrong data output as a result. Therefore, a user would observe a failing read operation. In a memory device using static sense amplifiers, the above situations do not cause a failing read operation but might determine a push-out of the access time.

SUMMARY OF THE INVENTION

An object of the present invention is to provide an ATD circuit for an electronic memory device having structural and functional features, such as to confer immunity against glitches which could appear on the memory address inputs.

This object is achieved in accordance with the invention by replacing the STRETCH circuit with an ATD generator circuit block which is active to guarantee a minimum length Tpmin of the ATD pulse under every operating condition. The ATD circuit comprises a global ATD generator circuit having one input connected to the output of the NOR logic gate and producing a final ATD pulse.

Advantageously, the global ATD generator circuit comprises: a master slave device which is controlled by an input signal received from the output of the NOR gate; a central and final ATD generator which is connected downstream to the master-slave device; and a further logic gate connected to the output of the final ATD generator and producing the final ATD pulse.

BRIEF DESCRIPTION OF THE DRAWINGS

The features and the advantages of the ATD circuit according to the present invention will be appreciated by the following description of a preferred embodiment which is disclosed making reference to the annexed drawings as a mere example of the principle of the invention and without the intention to limit the invention.

DETAILED DESCRIPTION OF THE PREFERRED EMBODIMENTS

Figure 7:
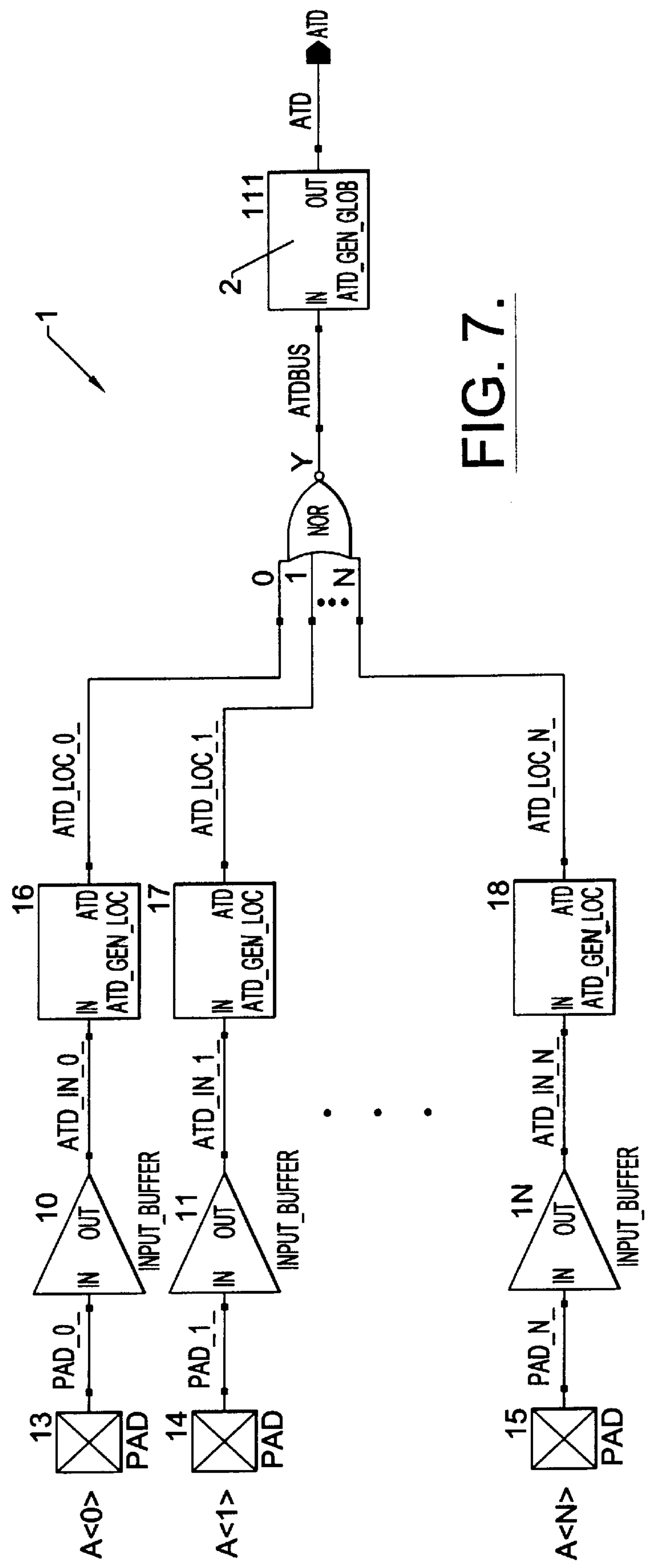
FIG. 7 is a simplified diagram of an ATD circuit realized according to the present invention.

With reference to the enclosed drawings, and more specifically to FIG. 7, numeral 1 is used to globally indicated a glitch immune ATD circuit according to the present invention. The ATD circuit 1 has a main structure which corresponds substantially to that of the known ATD circuit shown in FIG. 2, but with the STRETCH circuit replaced by a generator circuit ATD_GEN_GLOB.

Figure 1:
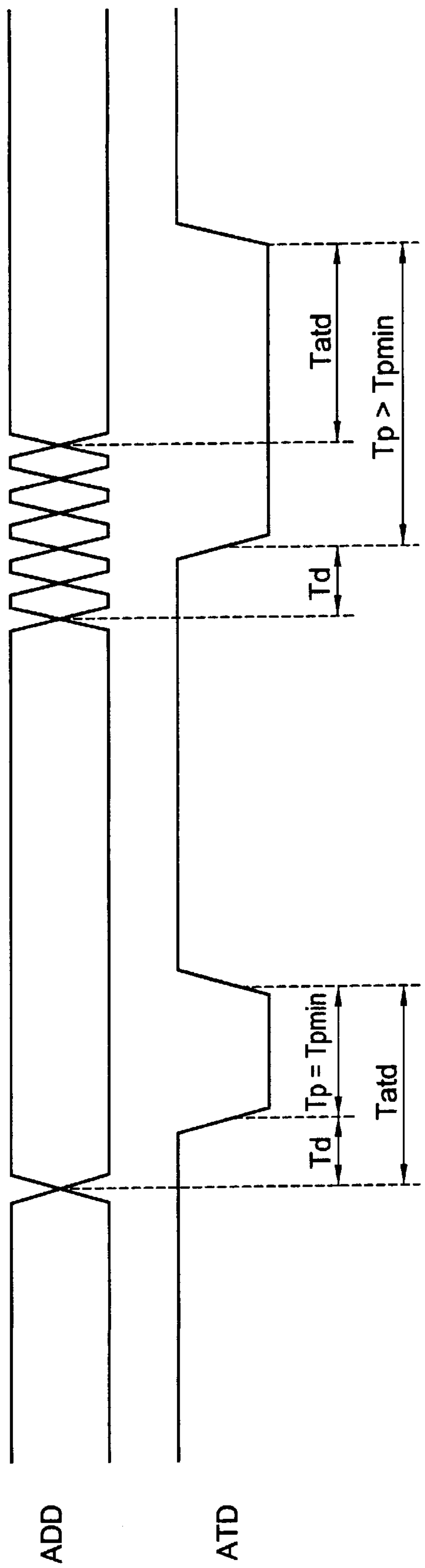
FIG. 1 shows a schematic diagram reporting a plot versus time of an ATD signal including the time delays of its rising and falling edges in accordance with the prior art.
Figure 2:
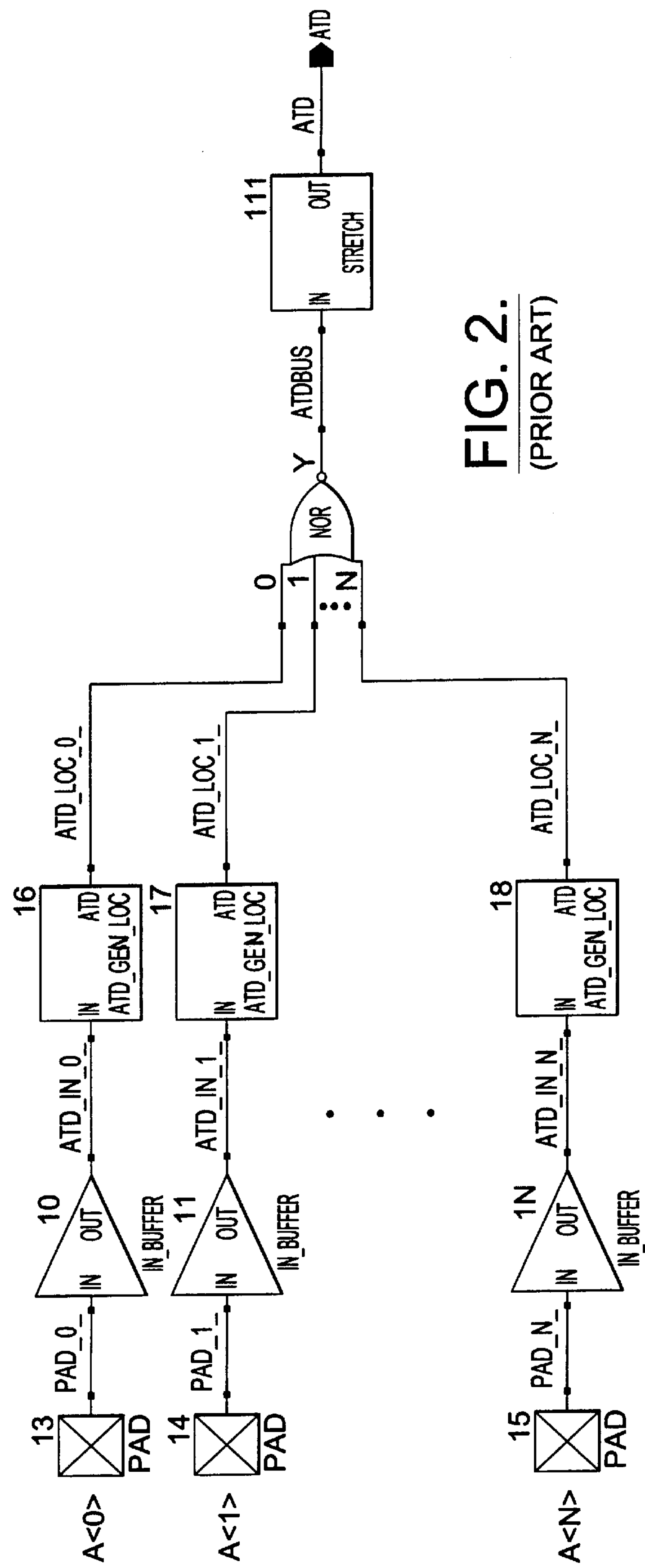
FIG. 2 shows a simplified schematic diagram of an ATD circuit of the prior art.

As already disclosed with reference to FIG. 2, the ATD circuit 1 is connected to a plurality of input pads A<0>, . . . , A<N> of the memory device which represent an array of address inputs each of which is connected to a corresponding address input buffer I0, . . . , IN. Each input buffer comprises an output terminal connected to a corresponding input of an ATD local generator circuit ATD_GEN_LOC.

The single output of each local generator ATD_GEN_LOC is connected to an input of a NOR logic gate having N inputs and an output Y. This output Y is connected to an input of a global ATD generator circuit 2 which is also indicated as ATD_GEN_GLOB.

Figure 8:
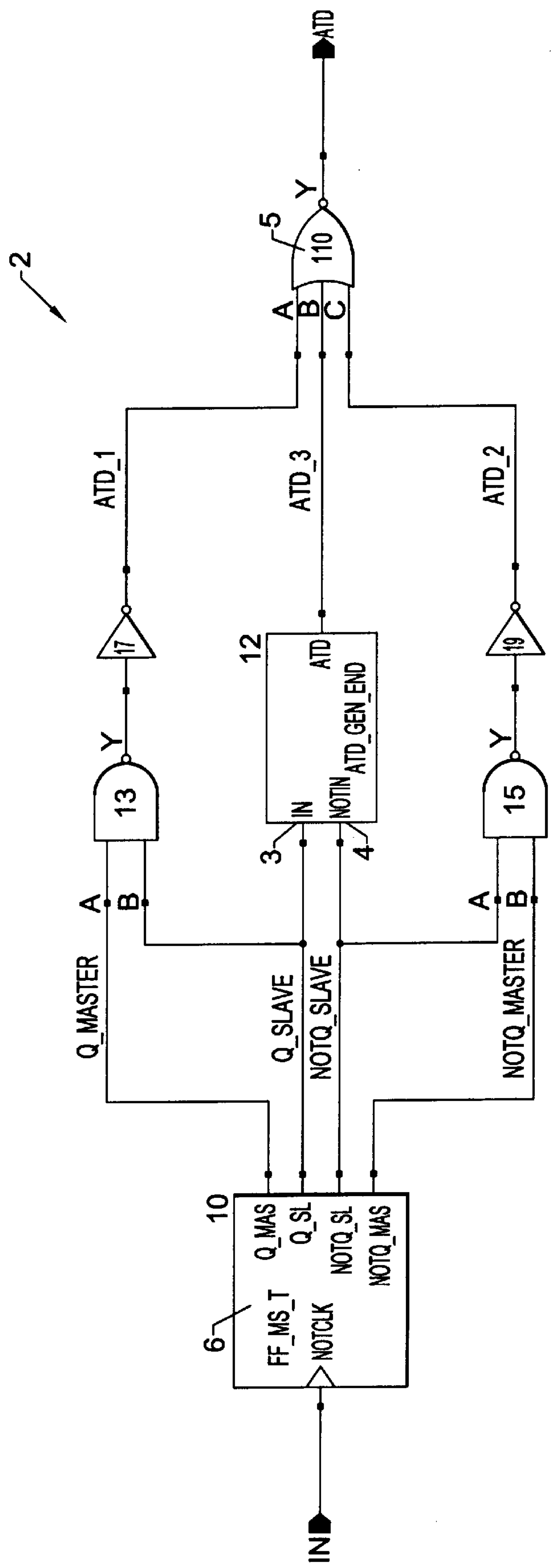
FIG. 8 is a more detailed schematic diagram of an inventive portion of the ATD circuit according to the invention.

FIG. 8 shows a more detailed diagram in which the structure of the generator circuit 2 is clearly represented. The global ATD generator circuit 2 includes: a flip-flop master slave device 6 (FF_MS_T) which is controlled by the input signal NOTCLK received from the above mentioned output Y of the NOR gate; a central and final ATD generator ATD_GEN_END which is connected downstream to the master-slave FF_MS_T; and a three input NOR gate 5 connected to the output of the final ATD generator. The output of this NOR gate produces the final ATD pulse.

Figure 3:
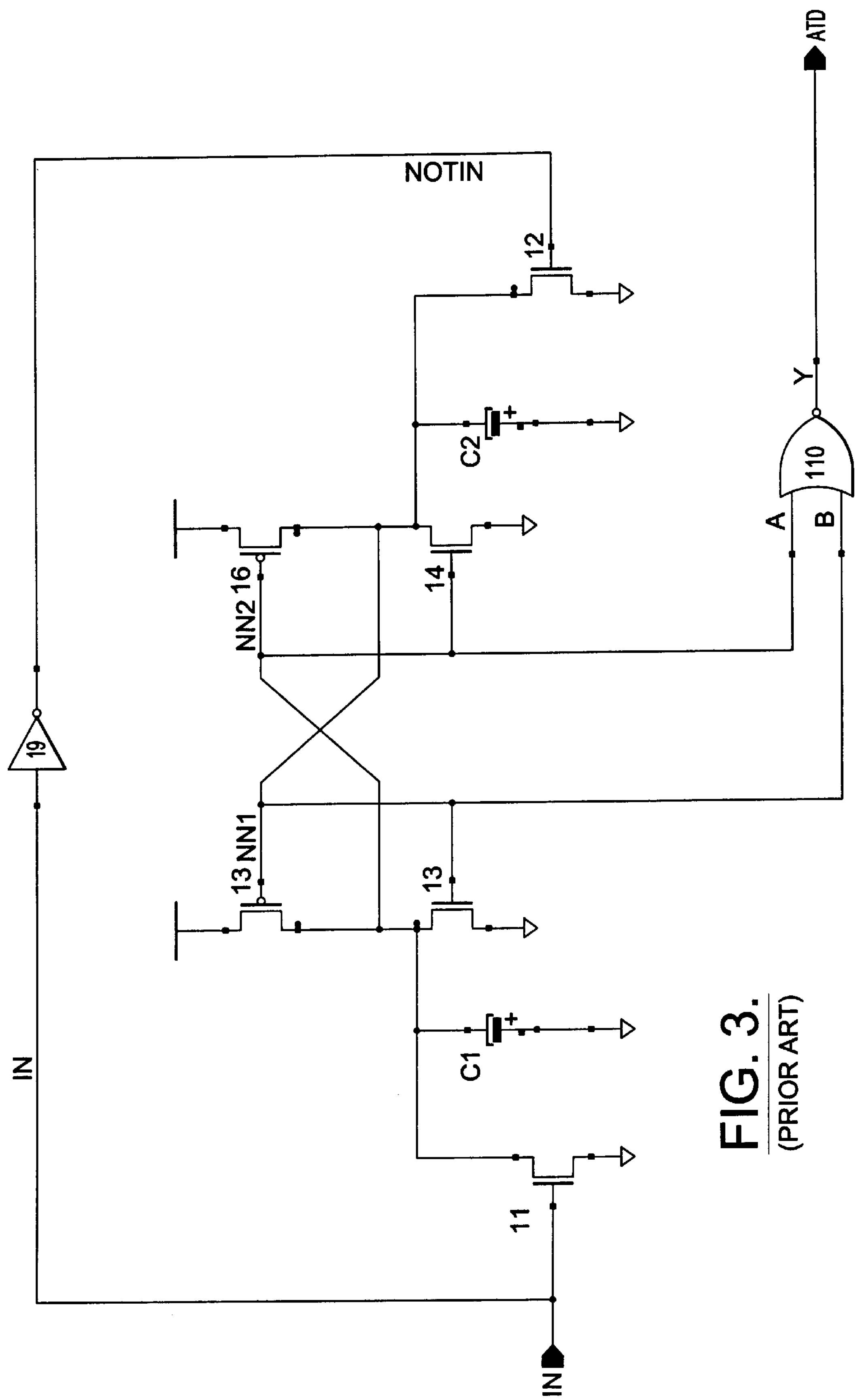
FIG. 3 shows a simplified structure of an ATD generator circuit of the prior art.
Figure 4:
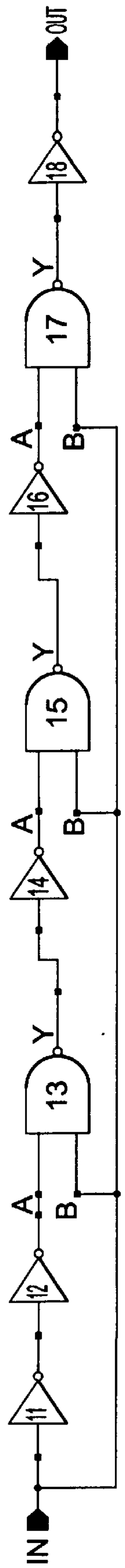
FIG. 4 shows the circuit structure of a STRETCH circuit used to delay the rising edge of a signal ATDBUS as in the prior art.
Figure 5A:
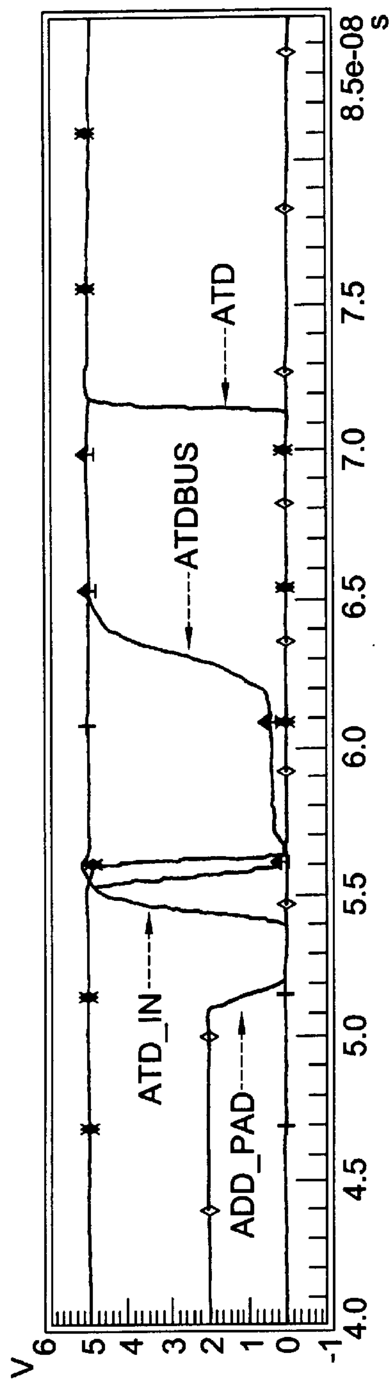
FIGS. 5*a*, 5*b*, 5*c*, 5*d*, 5*e* show respective plots of voltage signals versus time indicating how the prior art ATD circuitry of FIG. 2 responds to an address input transition and to different glitches which are slightly different in amplitude respectively.
Figure 5B:
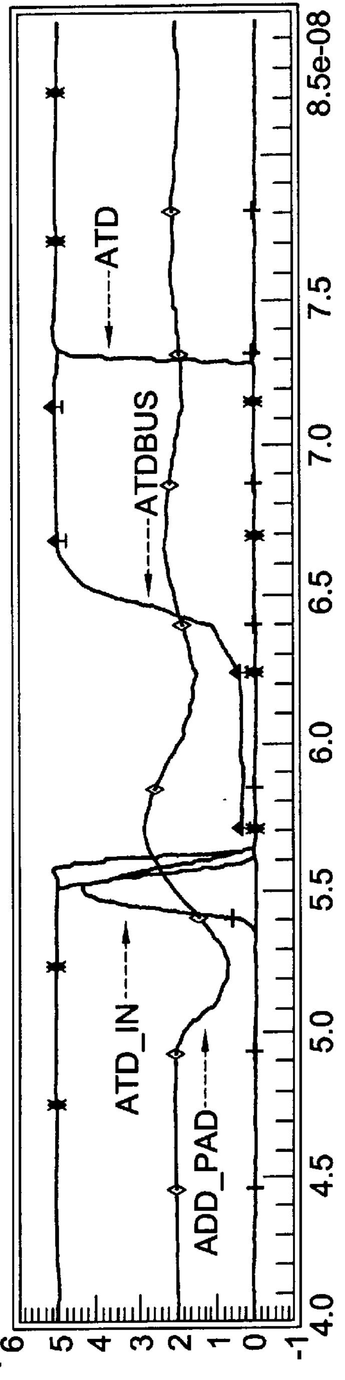
Figure 5C:
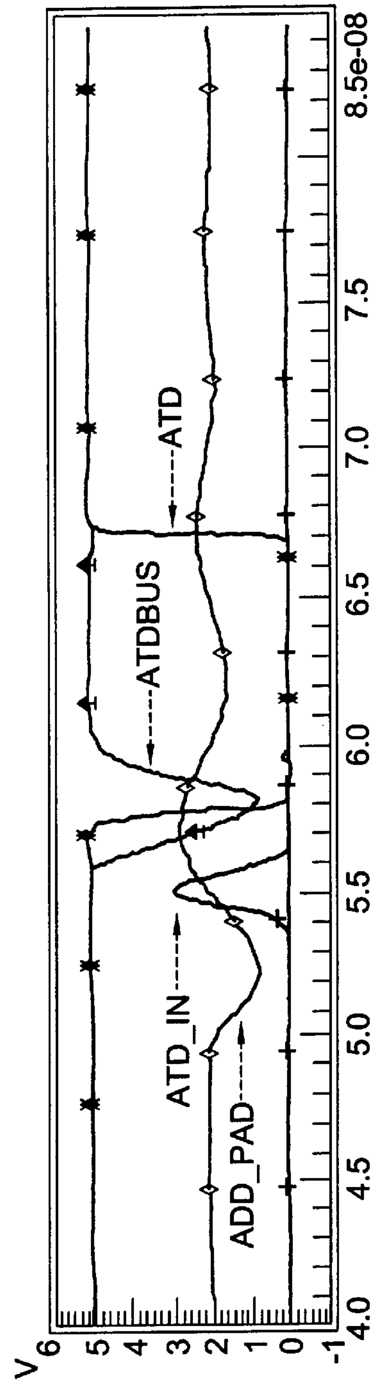
Figure 5D:
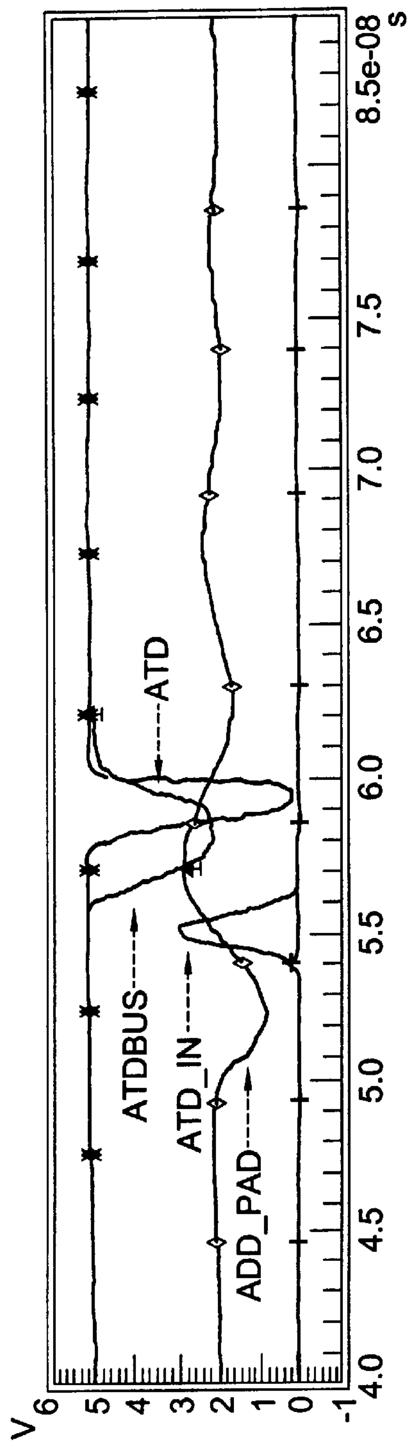
Figure 5E:
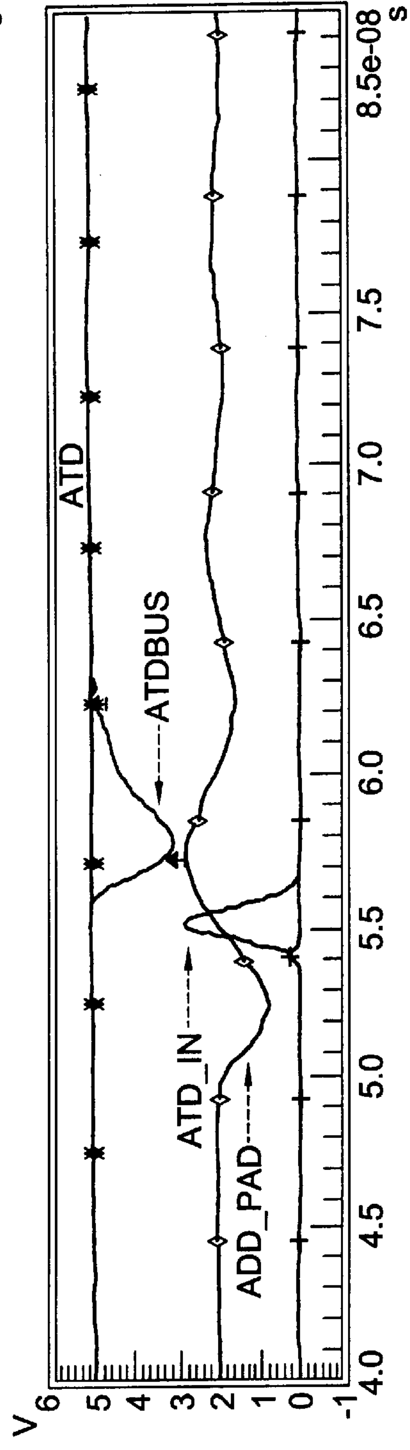
Figure 6:
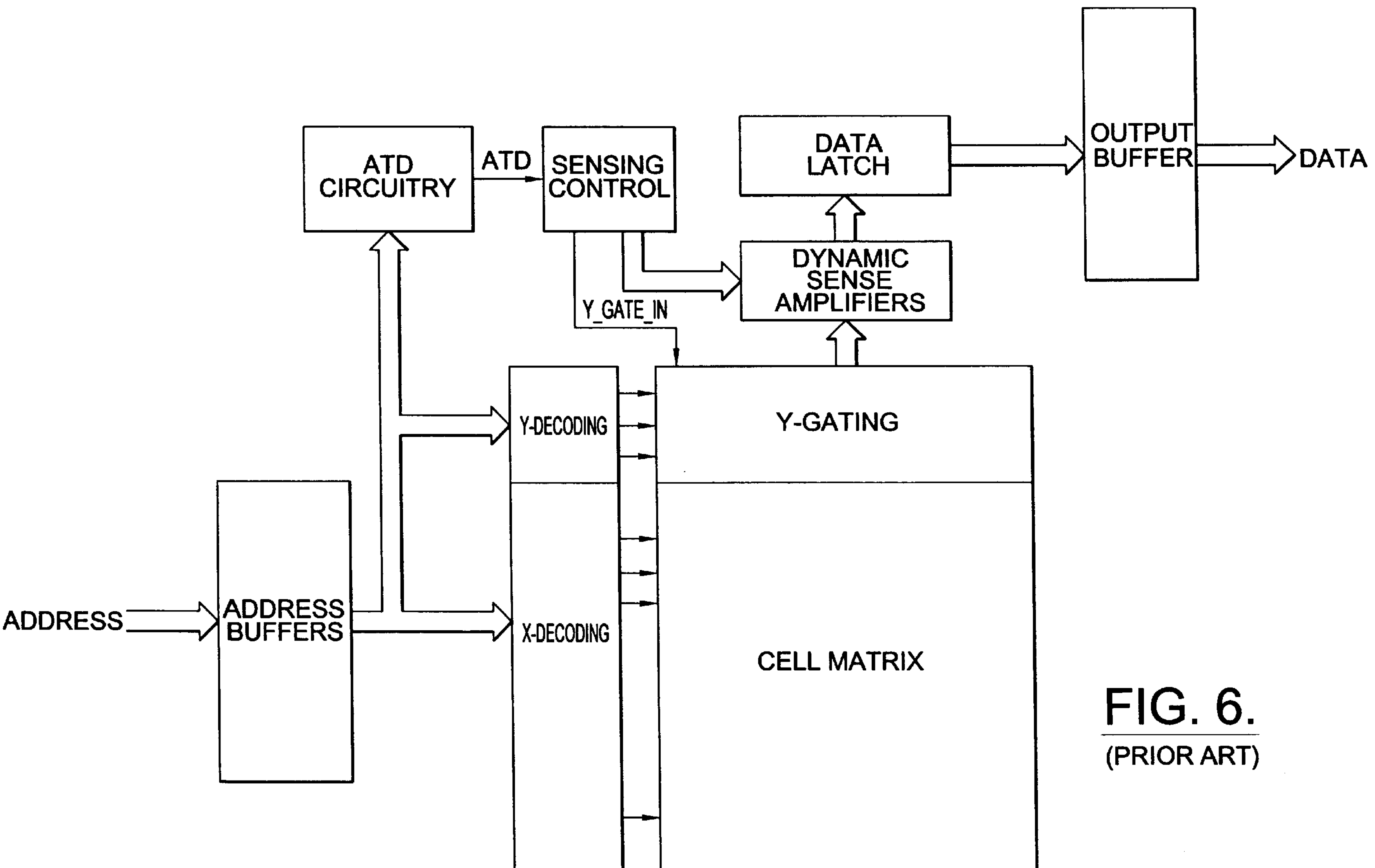
FIG. 6 shows a simplified block diagram of the read path of a non-volatile memory circuit using dynamic sense amplifiers as in the prior art.

The master-slave device presents four outputs: Q_MAS, NOTQ_MAS, Q_SL, NOTQ_SL which correspond to the two outputs of the master portion and to the two outputs of the slave portion, respectively. The internal structure of the final ATD generator corresponds substantially to the circuit structure shown in FIG. 3 with the remark that it has two separate inputs 3 and 4 driven by the two slave outputs Q_SL and NOTQ_SL of the master-slave device 6.

The three inputs A, B, C of the NOR gate 5 receive respective signals ATD_1, ATD_3, ATD_2. The signal ATD_3 is provided by the output of the final ATD generator ATD_GEN_END. The other two input signals ATD_1 and ATD_2 are generated by a logic AND operation on two output signals of the master-slave device 6. More particularly, the ATD_1 signal is generated by a logic AND operation of the two output signals Q_MAS and Q_SL; while the ATD_2 signal is generated by a logic AND operation of the other two output signals NOTQ_MAS and NOTQ_SL. The AND operation is performed by a connection between a NAND gate I3 and an inverter I7 for the first signal ATD_1 and by a similar connection between a NAND gate I5 and an inverter I9 for the second signal ATD_2.

Figure 9:
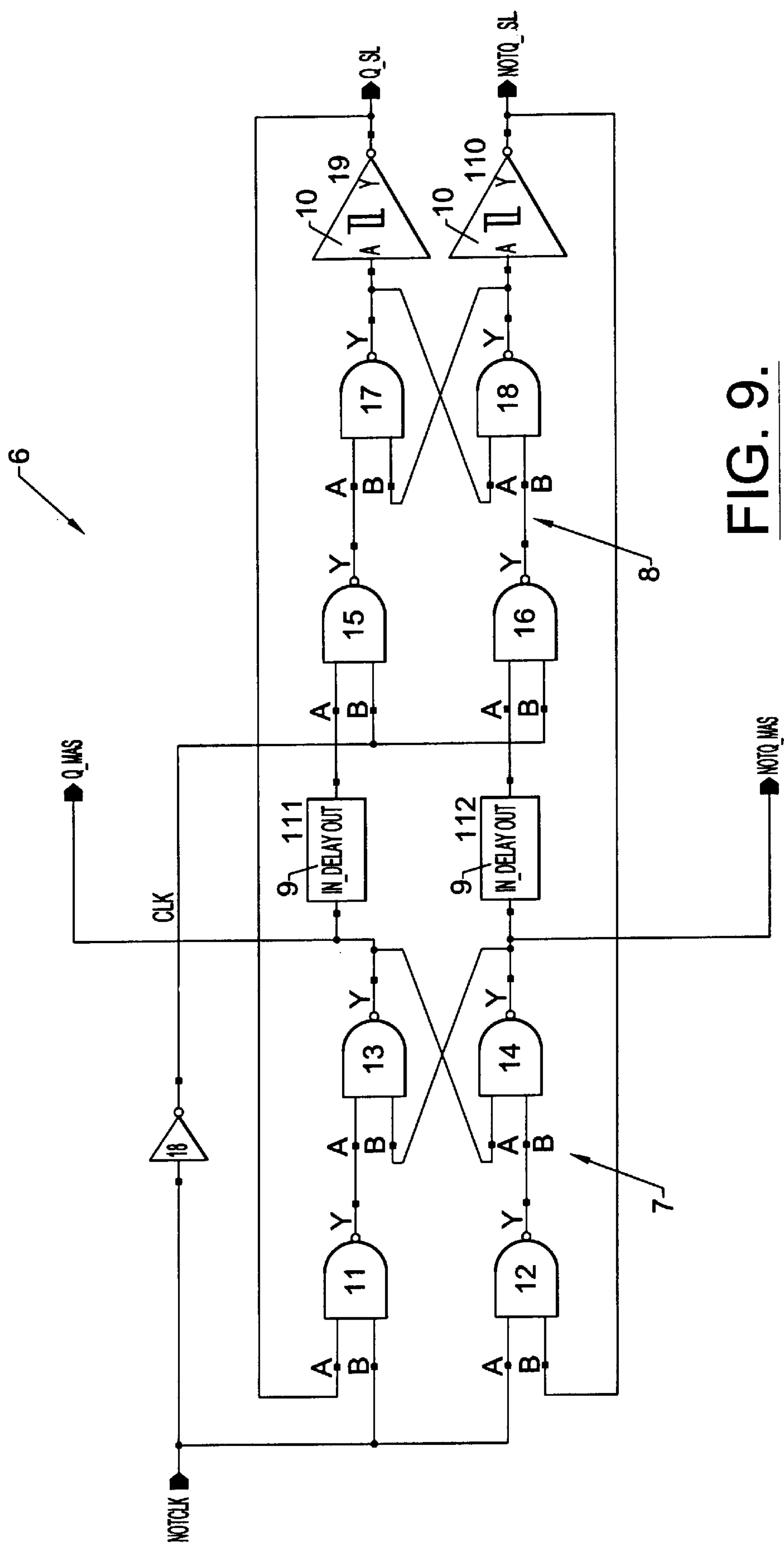
FIG. 9 is a detailed schematic diagram of a portion of the ATD circuit according to the invention.
Figure 10A:
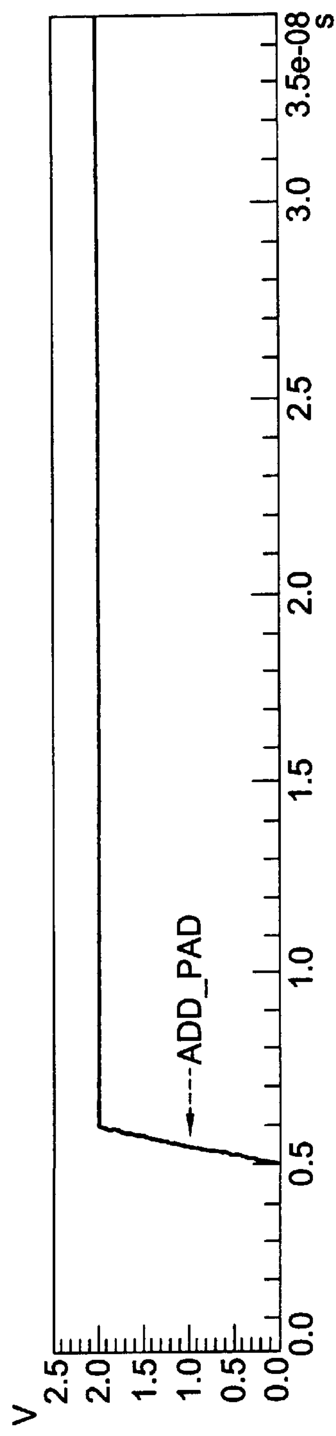
FIGS. 10*a*, 10*b*, 10*c*, 10*d*, 10*e* show respective plots of voltage signals versus time indicating how the ATD circuit according to the invention responds to a single address input transition.
Figure 10B:
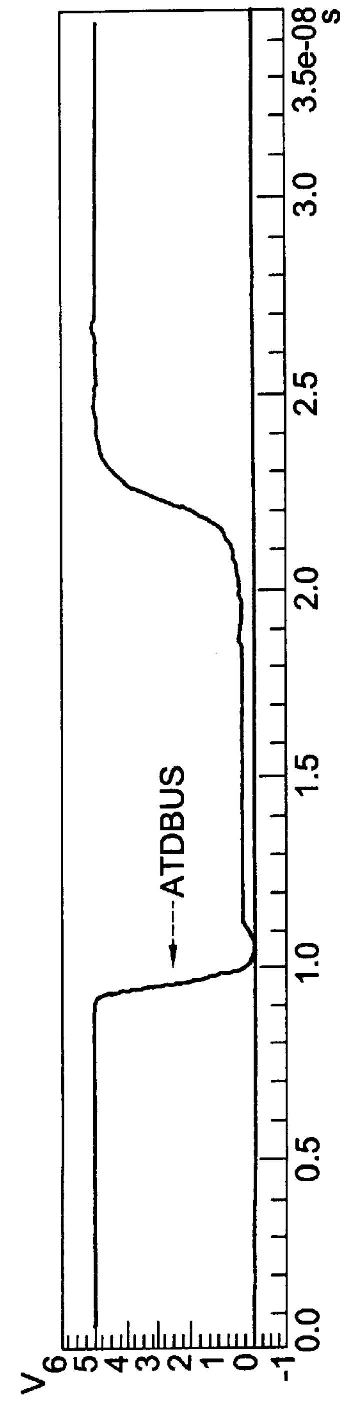
Figure 10C:
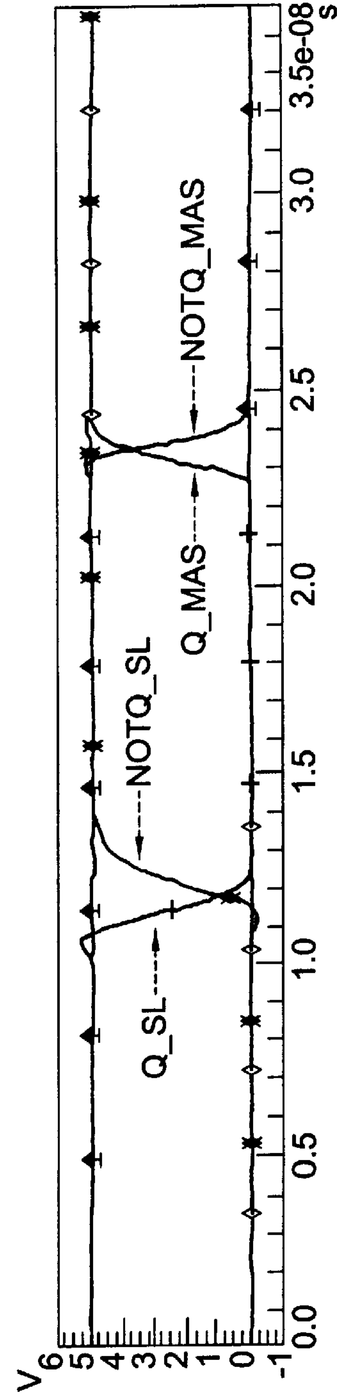
Figure 10D:
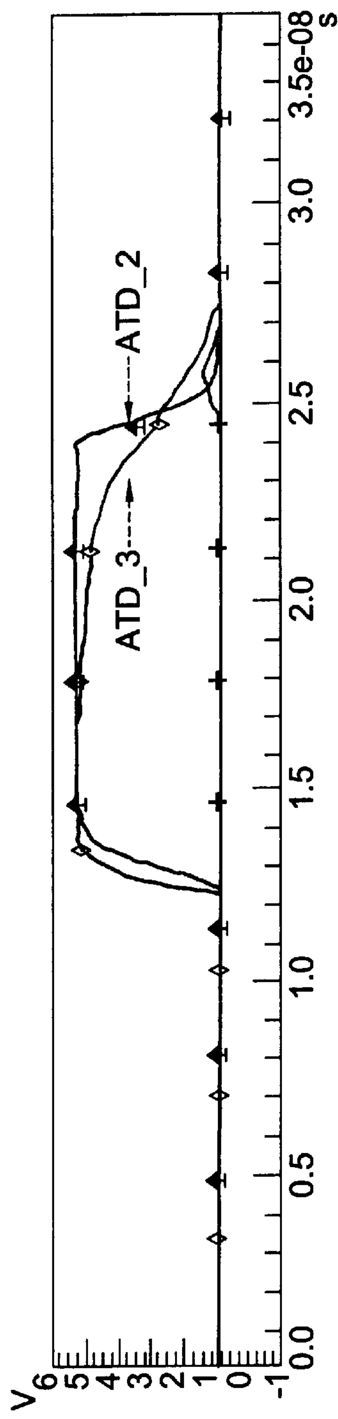
Figure 10E:
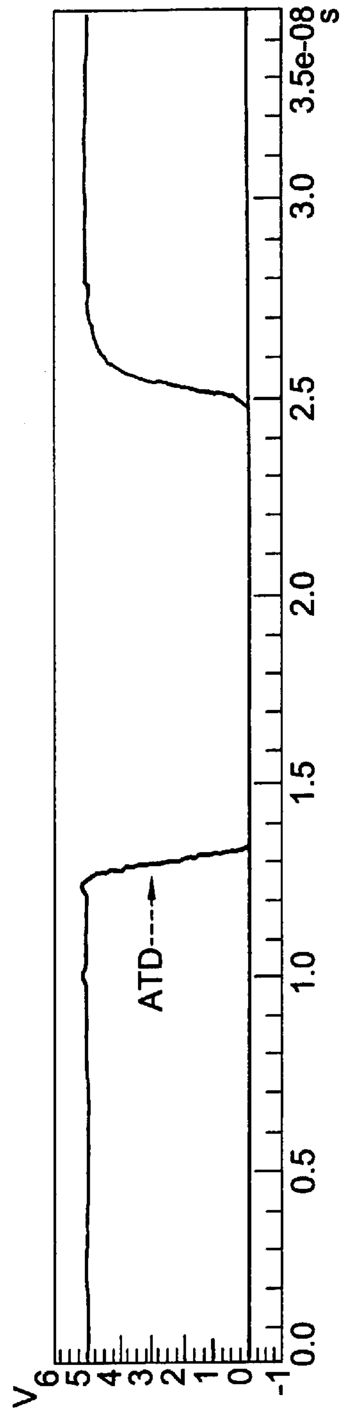
Figure 11A:
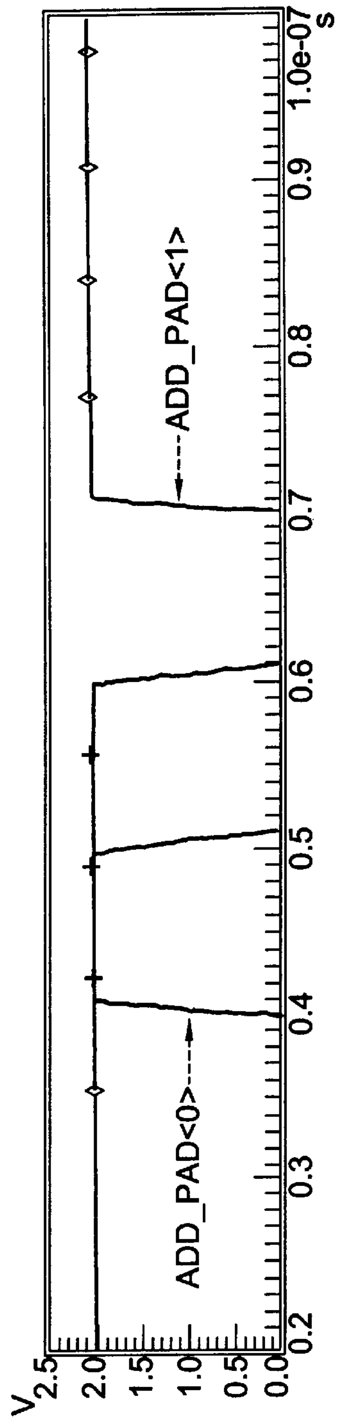
FIGS. 11*a*, 11*b*, 11*c*, 11*d*, 11*e* show respective plots of voltage signals versus time indicating how the ATD circuit according to the invention responds to multiple non-simultaneous address input transitions.
Figure 11B:
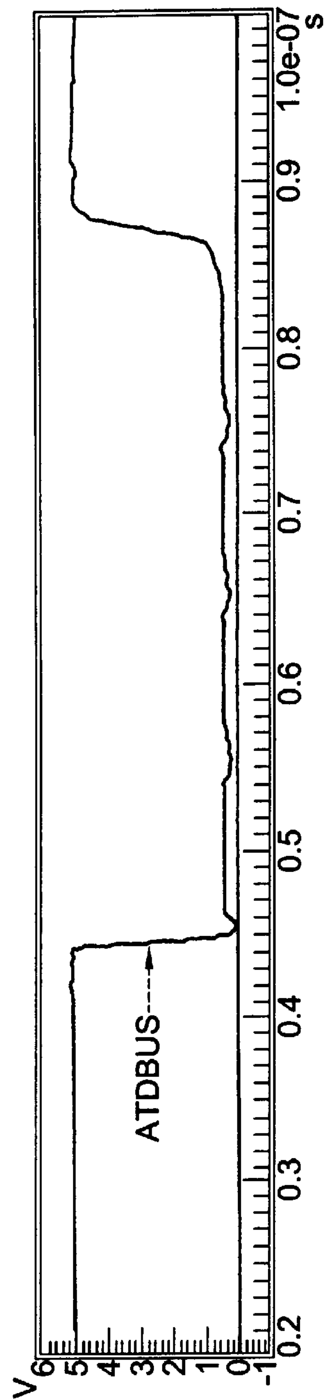
Figure 11C:
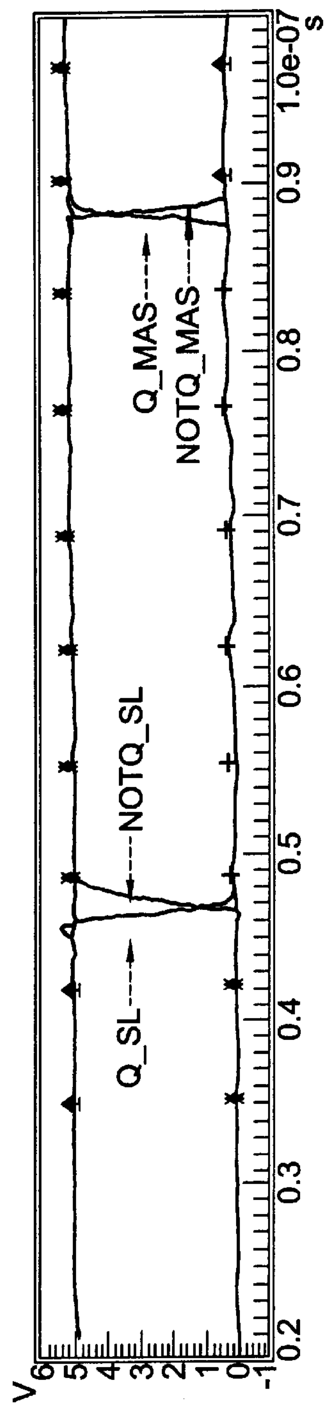
Figure 11D:
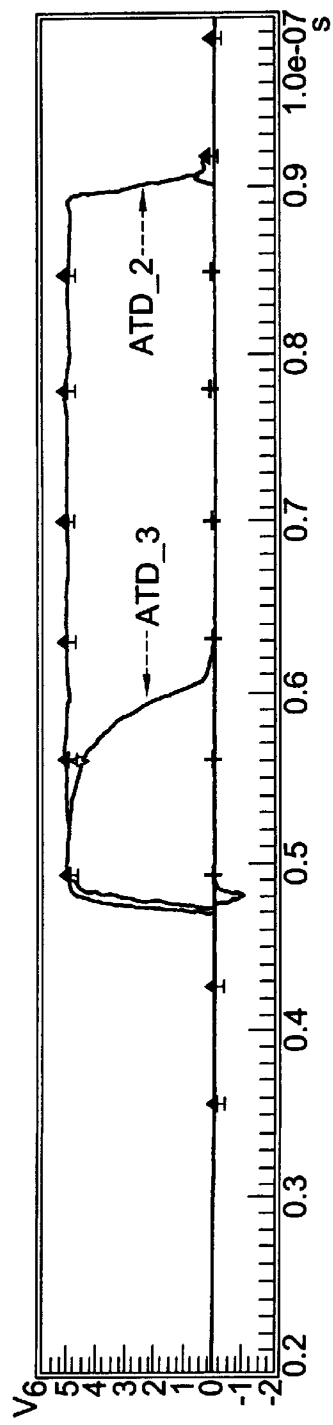
Figure 11E:
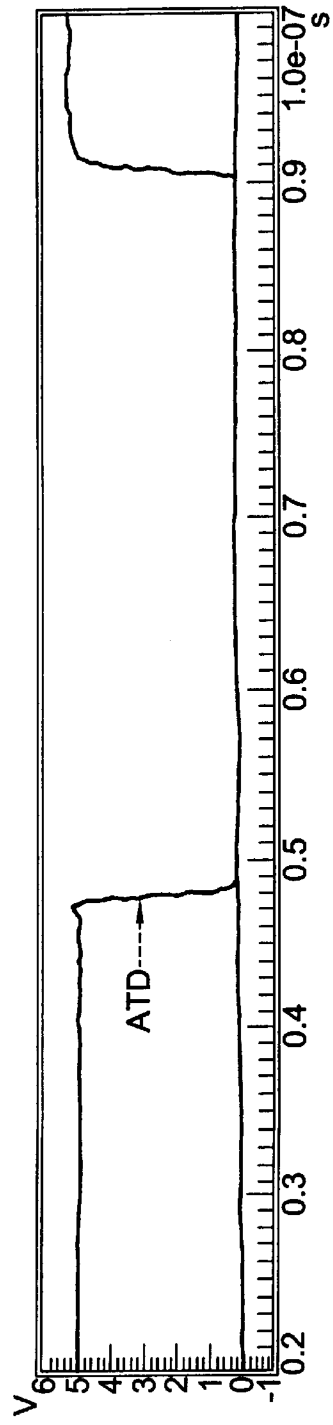
Figure 12A:
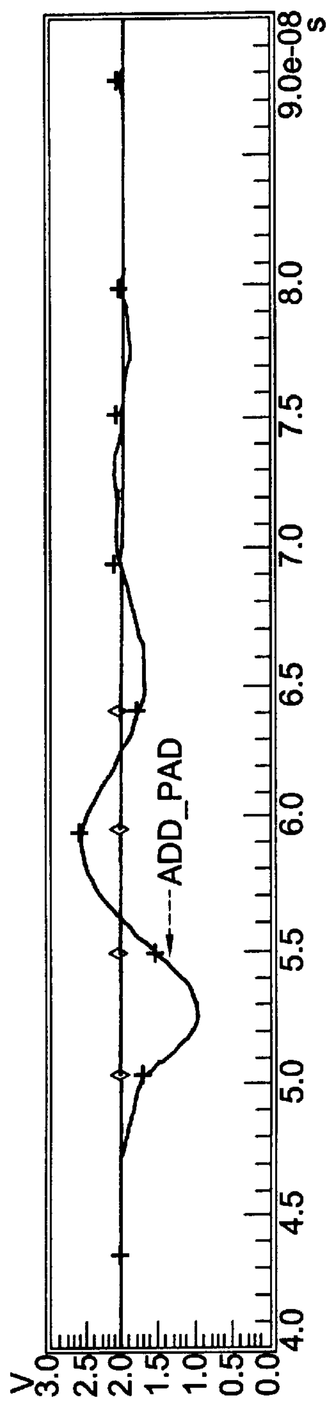
FIGS. 12*a*, 12*b*, 12*c*, 12*d*, 12*e* show respective plots of voltage signals versus time indicating how the ATD circuit according to the invention responds to a glitch whose extent is sufficient to produce an ATD pulse.
Figure 12B:
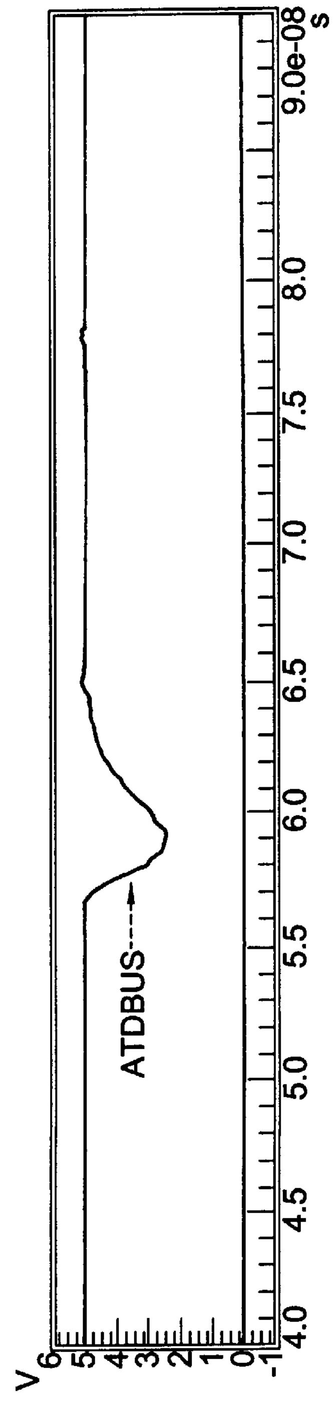
Figure 12C:
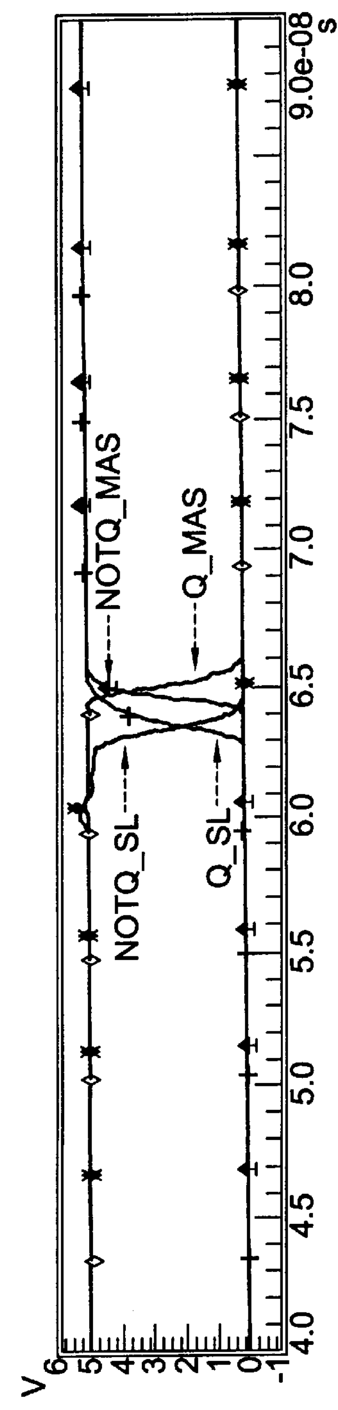
Figure 12D:
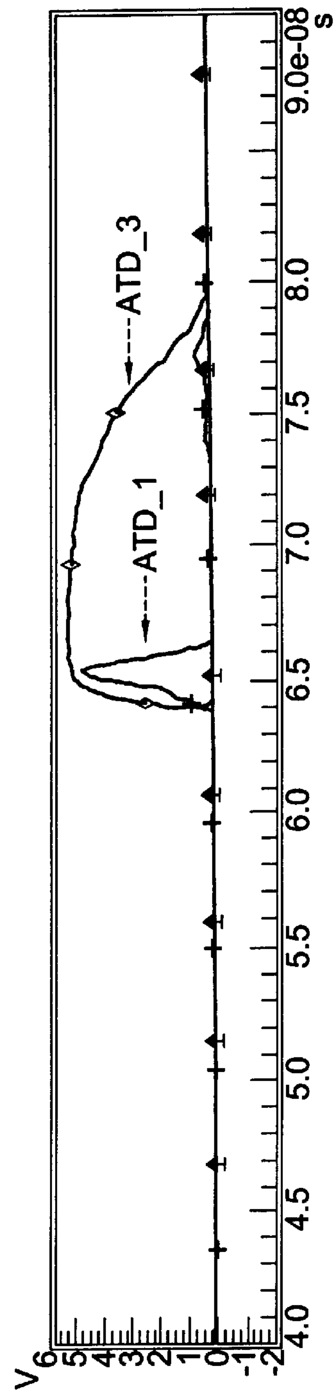
Figure 12E:
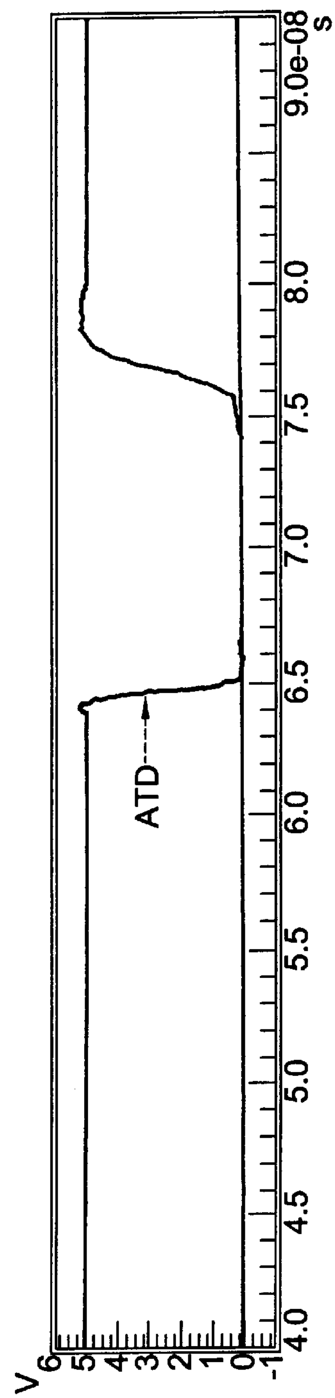
Figure 13A:
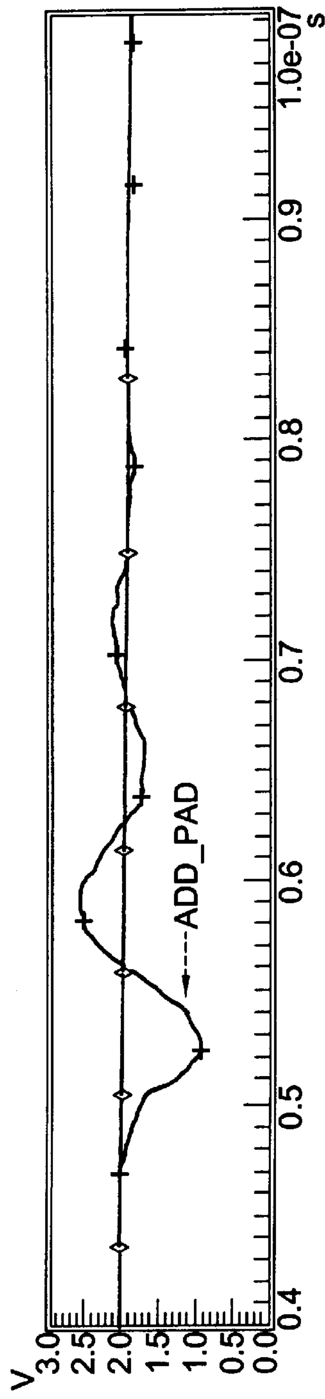
FIGS. 13*a*, 13*b*, 13*c*, 13*d*, 13*e* show respective plots of voltage signals versus time indicating how the ATD circuit according to the invention responds to a glitch whose extent is not sufficient to produce an ATD pulse.
Figure 13B:
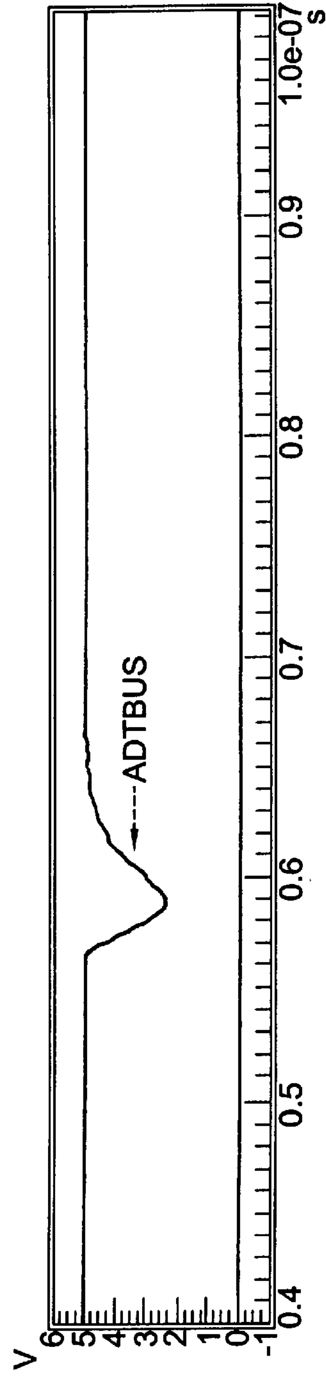
Figure 13C:
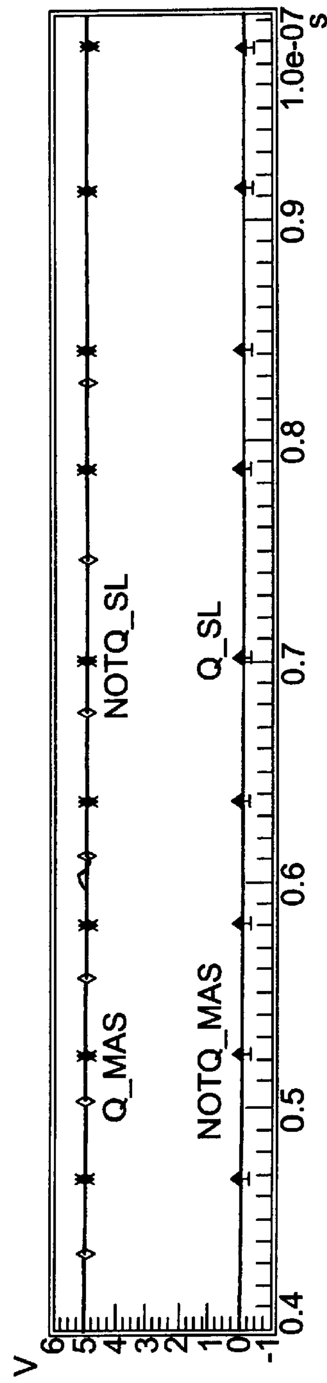
Figure 13D:
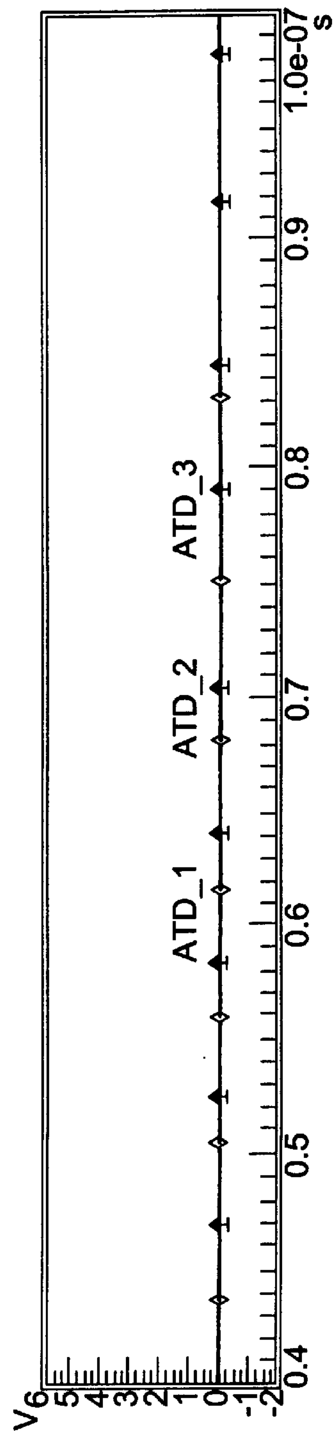
Figure 13E:
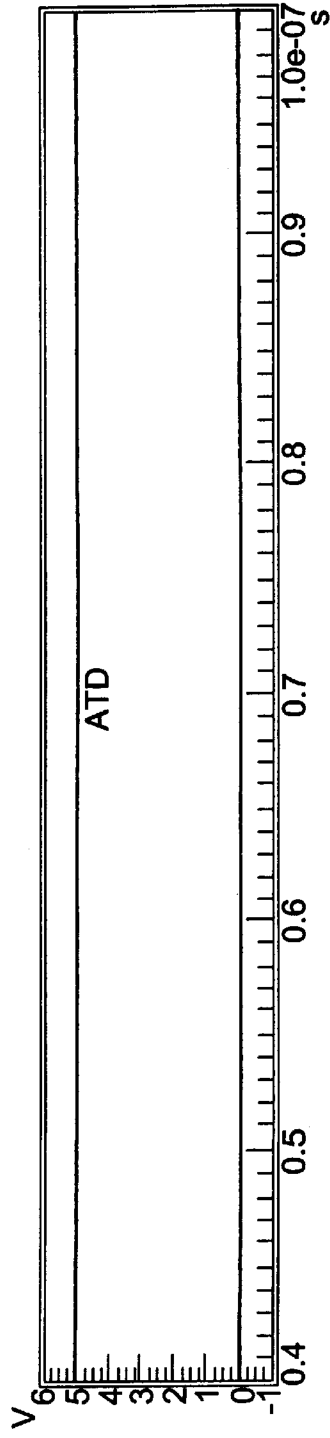

FIG. 9 shows a detailed diagram of the internal structure of the master-slave device 6. This device 6 includes a master portion 7 connected upstream to a slave portion 8. The master portion 7 comprises two input NAND logic gates, both receiving the input signal NOTCLK, and two output NAND logic gates producing the output signals Q_MAS and NOTQ_MAS.

The slave portion 8 comprises two input NAND logic gates receiving from the master portion 7 the output signals Q_MAS and NOTQ_MAS, respectively. The slave portion 8 receives each of the output signals from the master portion 7 through at least one delay block 9. The slave portion 8 also comprises two output NAND logic gates producing the output signals Q_SL and NOTQ_SL through respective inverting Schmitt triggers 10.

The threshold voltage Vtl of the two Schmitt triggers 10 must be lower than the trip-point of the last two output NAND gates of the slave portion 8. For this reason, a low-to-high transition of one of the two outputs Q_SL and NOTQ_SL of the master-slave device 6 can occur only in response to a corresponding transition of the slave portion 8.

The operation of the ATD circuit according to the present invention is now considered starting from a steady state condition in which the signal ATDBUS is high. The outputs Q_MAS and Q_SL of the master-slave device 6 have opposite logic levels. This also applies for the other outputs NOTQ_MAS and NOTQ_SL. Hence the three signals ATD_1, ATD_2, and ATD_3 are low and the ATD signal is high.

In response to the falling edge of the signal ATDBUS, the outputs Q_SL and NOTQ_SL, of the master-slave device 6 switch. Accordingly, in response to the transitions of the signals Q_SL and NOTQ_SL one of the two signals ATD_1 or ATD_2 goes high. The output ATD_3 of the final ATD generator goes high too. As a consequence the output of the NOR gate 5 goes low having at least two inputs with a high logic level. The signal ATD_3 returns to a low logic level after a predetermined time interval from the detection of a transition of the two signals Q_SL and NOTQ_SL.

In response to the rising edge of the signal ATDBUS the two outputs Q_MAS and NOTQ_MAS of the master-slave device 6 switch. Accordingly, the signal ATD_1 or the signal ATD_2 returns to a low logic level. If we consider the three signals ATD_1, ATD_2 and ATD_3, the later occurring falling edge among these signals determines the rising edge of the final ATD pulse.

The ATD circuitry according to the invention should be trimmed to have a signal ATD_3 more or less equal to the signal ATD_1 (or ATD_2) in response to a single address transition. This is easily achievable, since all the above signals are controlled by the same kind of ATD generator circuits. For instance, the signal ATD_3 is generated by the final ATD generator, while the signals ATD_1 or ATD_2 depend from the signal ATDBUS whose duration is set by a local ATD generator.

Three possible operating conditions of the ATD circuitry of the present invention are now considered:

1) Single address transition or multiple simultaneous transitions;

2) Multiple non-simultaneous transitions; and

3) Glitch determining an ATDBUS pulse shorter than a typical one.

1) In such a situation the signal ATDBUS is a pulse whose duration is controlled by a local ATD generator circuit ATD_GEN_LOC. The duration of the signals ATD_1 (or ATD_2) and ATD_3 is approximately the same and the duration of the final ATD pulse corresponds to Tpmin as clearly shown in the five diagrams reported in FIGS. 10*a*, 10*b*, 10*c*, 10*d*, 10*e* having the same time base.

2) The signal ATDBUS is activated in response to the first detected address transition and is interrupted after a predetermined period of time from the last address transition detection. Hence, the ATD pulse is controlled by the signal ATD_1 (or ATD_2) which is longer than ATD_3 and its duration is longer than the time period Tpmin.

3) If the ATDBUS pulse is shorter than a typical one, then the master-slave device 6 responds with a status transition. If the ATDBUS pulse is just a glitch, the master-slave device 6 responds with a status transition or ignores the glitch according to the extent of the glitch. The set of FIGS. 12 and 13 represent how the various signals of the ATD circuitry according to the invention evolve in response to these last two possible input situations. In any case, if the master-slave device responds with a status transition, the signal ATD_1 (or ATD_2) is shorter than a typical one and the duration of the final ATD pulse is controlled just by the signal ATD_3. The duration of the final ATD pulse corresponds in such a case to the period of time Tpmin.

From the above description it should be clearly evident that no positive glitches occur on either the two outputs Q_SL or NOTQ_SL of the slave portion 8 when the master-slave device 6 is triggered by a glitch which is not adequate to force a status transition of the master-slave device itself. The final ATD generator ATD_GEN_END is always stimulated in an appropriate way since the internal delay of the master-slave feedback loop limits the maximum switching frequency of such a master-slave device 6. Such a delay may be trimmed by the delay block 9. Furthermore, there is no possibility to cause a positive glitch on one of the two signals ATD_1 or ATD_2 unless in response to a status transition of the slave stage of the FF_MS_T circuit. Hence the minimum width of the pulse ATD_3 is always guaranteed, as well as the minimum duration of the final ATD pulse.

The stability of the device is guaranteed even when two or more close glitches occur on the ATDBUS node, or even when glitches followed by a good pulse occur. The ATD circuit according to the invention is therefore able to guarantee the minimum length Tpmin of the ATD pulse under every operating condition.

That which is claimed is:

1. An electronic memory device comprising:

a plurality of input pads;

a plurality of address input buffers having outputs and having inputs connected to respective input pads;

a plurality of local address transition detection (ATD) generator circuits having outputs and having inputs connected to respective outputs of said plurality of address input buffers;

a logic gate having an output and having respective inputs connected to outputs of said local ATD generator circuits;

a global ATD generator circuit having an input connected to the output of said logic gate and for producing a final ATD pulse, wherein said global ATD generator circuit comprises:

a master-slave device controlled by an input signal from the output of said logic gate;

a central and final ATD generator circuit which is connected downstream from the master-slave device; and a second logic gate connected to the output of the final ATD generator circuit and producing the final ATD pulse.

2. An electronic memory device according to claim 1, wherein said second logic gate is a NOR gate having three inputs; and wherein a third input of said NOR gate receives the output of the final ATD generator circuit.

3. An electronic memory device according to claim 2, further comprising first and second means for performing respective AND logic operations on output signals of said master-slave device upstream of the first and second inputs of said NOR gate.

4. An electronic memory device according to claim 3, wherein said first and second means each comprise a NAND gate and an inverter connected thereto.

5. An electronic memory device according to claim 1, wherein said master-slave device presents four outputs which correspond to two outputs of the master portion and to two outputs of the slave portion, respectively.

6. An electronic memory device according to claim 5, wherein said central and final ATD generator has two separate inputs driven by the two slave outputs of the master-slave device.

7. An electronic memory device according to claim 1, wherein said master-slave device includes a slave portion and a master portion connected upstream from the slave portion; wherein the master portion comprises two input logic gates both receiving the input signal from the output of said logic gate and two output logic gates producing two output master signals; and wherein the slave portion comprises two input logic gates receiving from the master portion the two output master signals, respectively.

8. An electronic memory device according to claim 7, further comprising at least one delay block; and wherein said slave portion receives each of the two output master signals through the at least one delay block.

9. An electronic memory device according to claim 7, further comprising two inverting Schmitt triggers; and wherein the slave portion has two output logic gates producing two output slave signals through respective inverting Schmitt triggers.

10. An electronic memory device according to claim 9, wherein a threshold voltage of the two Schmitt triggers is lower than the trip-point of the last two output logic gates of the slave portion.

11. An address transition detection (ATD) circuit for an electronic memory device comprising a plurality of input pads, and a plurality of address input buffers having outputs and having inputs connected to respective input pads, the ATD circuit comprising:

- a plurality of local ATD generator circuits having outputs and having inputs connected to respective outputs of the plurality of address input buffers;
- a first at least one logic gate having an output and having respective inputs connected to outputs of said local ATD generator circuits;
- a global ATD generator circuit having an input connected to the output of said at least one logic gate and for producing a final ATD pulse, wherein said global ATD generator circuit comprises:
  - a master-slave device controlled by an input signal from the output of said at least one logic gate;
  - a central and final ATD generator circuit which is connected downstream from the master-slave device; and
  - a second at least one logic gate connected to the output of the final ATD generator circuit and producing the final ATD pulse.

12. An ATD circuit according to claim 11, wherein said second at least one logic gate is a NOR gate having three inputs; and wherein a third input of said NOR gate receives the output of the final ATD generator circuit.

13. An ATD circuit according to claim 12, further comprising first and second means for performing respective AND logic operations on output signals of said master-slave device upstream of the first and second inputs of said NOR gate.

14. An ATD circuit according to claim 13, wherein said first and second means each comprise a NAND gate and an inverter connected thereto.

15. An ATD circuit according to claim 11, wherein said master-slave device presents four outputs which correspond to two outputs of the master portion and to two outputs of the slave portion, respectively.

16. An ATD circuit according to claim 15, wherein said central and final ATD generator has two separate inputs driven by the two slave outputs of the master-slave device.

17. An ATD circuit according to claim 11, wherein said master-slave device includes a slave portion and a master portion connected upstream from the slave portion; wherein the master portion comprises two input logic gates both receiving the input signal from the output of said logic gate and two output logic gates producing two output master signals; and wherein the slave portion comprises two input logic gates receiving from the master portion the two output master signals, respectively.

18. An ATD circuit according to claim 17, further comprising at least one delay block; and wherein said slave portion receives each of the two output master signals through the at least one delay block.

19. An ATD circuit according to claim 17, further comprising two inverting Schmitt triggers; and wherein the slave portion has two output logic gates producing two output slave signals through respective inverting Schmitt triggers.

20. An ATD circuit according to claim 19, wherein a threshold voltage of the two Schmitt triggers is lower than the trip-point of the last two output logic gates of the slave portion.

21. An address transition detection (ATD) circuit for an electronic memory device comprising a plurality of input pads, and a plurality of address input buffers having outputs and having inputs connected to respective input pads, the ATD circuit comprising:

- a plurality of local ATD generator circuits having outputs and having inputs connected to respective outputs of the plurality of address input buffers;
- a first at least one logic gate having an output and having respective inputs connected to outputs for said local ATD generator circuits; and
- a global ATD generator circuit having an input connected to the output of said at least one logic gate, said global ATD generator circuit comprising
  - a master-slave device controlled by an input signal from the output of said at least one logic gate, and
  - a central and final ATD generator circuit which is connected downstream from the master-slave device.

22. An ATD circuit according to claim 21 wherein said global ATD generator circuit further comprises a second at least one logic gate connected to the output of the final ATD generator circuit and producing the final ATD pulse.

23. An ATD circuit according to claim 22, wherein said second at least one logic gate is a NOR gate having three inputs; and wherein a third input of said NOR gate receives the output of the final ATD generator circuit.

24. An ATD circuit according to claim 23, further comprising first and second means for performing respective AND logic operations on output signals of said master-slave device upstream of the first and second inputs of said NOR gate.

25. An ATD circuit according to claim 24, wherein said first and second means each comprise a NAND gate and an inverter connected thereto.

26. An ATD circuit according to claim 21, wherein said master-slave device presents four outputs which correspond to two outputs of the master portion and to two outputs of the slave portion, respectively.

27. An ATD circuit according to claim 26, wherein said central and final ATD generator has two separate inputs driven by the two slave outputs of the master-slave device.

28. An ATD circuit according to claim 21, wherein said master-slave device includes a slave portion and a master portion connected upstream from the slave portion; wherein the master portion comprises two input logic gates both receiving the input signal from the output of said logic gate and two output logic gates producing two output master signals; and wherein the slave portion comprises two input logic gates receiving from the master portion the two output master signals, respectively.

29. An ATD circuit according to claim 28, further comprising at least one delay block; and wherein said slave portion receives each of said two output master signals through the at least one delay block.

30. An ATD circuit according to claim 28, further comprising two inverting Schmitt triggers; and wherein the slave portion has two output logic gates producing two output slave signals through respective inverting Schmitt triggers.

31. An ATD circuit according to claim 30, wherein a threshold voltage of the two Schmitt triggers is lower than the trip-point of the last two output logic gates of the slave portion.

* * * * *